United States Patent [19]

Rao

[11] 4,319,263
[45] Mar. 9, 1982

[54] DOUBLE LEVEL POLYSILICON SERIES TRANSISTOR DEVICES

[75] Inventor: G. R. Mohan Rao, Houston, Tex.

[73] Assignee: Texas Instruments Incorporated, Dallas, Tex.

[21] Appl. No.: 102,301

[22] Filed: Dec. 10, 1979

Related U.S. Application Data

[63] Continuation-in-part of Ser. No. 907,234, May 18, 1978, Pat. No. 4,213,139.

[51] Int. Cl.³ .......................................... H01L 27/02
[52] U.S. Cl. ...................................... 357/41; 357/23; 357/45; 357/46; 357/59
[58] Field of Search ...................... 357/23, 41, 45, 46, 357/59

[56] References Cited

U.S. PATENT DOCUMENTS 4,084,108  4/1978  Fujimoto .............................. 357/59
4,099,196  4/1978  Simko ................................... 357/59

*Primary Examiner*—Edward J. Wojciechowicz
*Attorney, Agent, or Firm*—John G. Graham

[57] ABSTRACT

A plurality of MOS transistors are formed as an integrated semiconductor device, adjacent transistors sharing a common source/drain region which is created by the edges of inverted regions beneath the gates of the transistors. These gates are first and second level polysilicon, with the second partly overlapping the first. On the opposite ends, the source and drain regions are formed by diffusion using the oxide under the first and second level poly as the diffusion mask.

10 Claims, 7 Drawing Figures

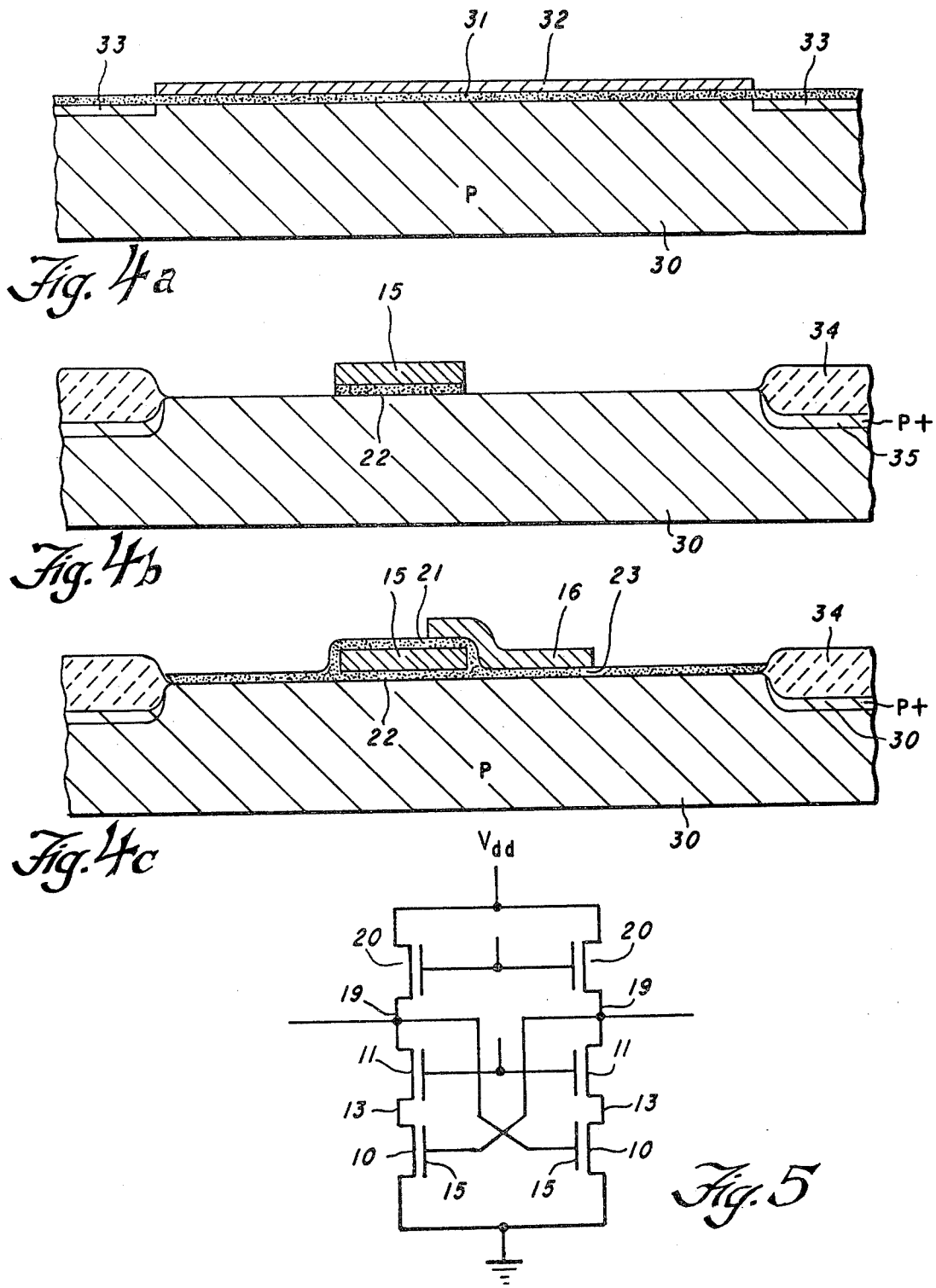

DOUBLE LEVEL POLYSILICON SERIES TRANSISTOR DEVICES

RELATED CASES

This application is continuation-in-part of my prior copending application Ser. No. 907,234, filed May 18, 1978, now U.S. Pat. No. 4,213,139 assigned to Texas Instruments.

BACKGROUND OF THE INVENTION

This invention relates to semiconductor devices, and more particularly to a series pair of N-channel silicon gate transistors and a process for making them.

In MOS integrated circuits such as sense amplifiers for dynamic memory arrays, or in various logic gates, pairs of transistors are connected with their source-to-drain paths in series. Usually a shared source/drain region between the two is a diffused N+ region, which occupies unnecessary space on the chip and introduces unwanted overlap capacitance and node capacitance, slowing the operation of the circuit.

A double level polysilicon process is widely used to make one-transistor memory cells, as described in U.S. patent applications Ser. No. 648,594, filed Jan. 12, 1976, and No. 722,841, filed Sept. 13, 1976, now U.S. Pat. No. 4,240,092 assigned to Texas Instruments. In this process, a capacitor is formed by the first level poly, and the transistor gate is formed by the second level which partly overlaps the first. Heretofore, the advantages of this structure have not been utilized in a series transistor structure.

It is the principal object of this invention to provide a semiconductor device in the form of a series transistor pair of small size and with reduced overlap capacitance and node capacitance. Another object is to provide a small-area series transistor pair which is made by a process compatible with standard N-channel silicon gate manufacturing techniques.

SUMMARY OF THE INVENTION

In accordance with an embodiment of the invention, a semiconductor device such as a metal-oxide-semiconductor or MOS series transistor pair is formed in an integrated circuit along with other transistors for peripheral circuitry. The transistor pair has gates formed by overlapping layers of double level polycrystalline silicon. No separate diffused region is used as the source/drain node between the series transistors, but instead the inverted region below the gate of one forms the source or drain of the other.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 4a—4c are elevation views in section of the semiconductor device of FIG. 1 and at successive stages in the manufacturing process, taken generally along the lines 3—3 in FIG. 1; and FIG. 5 is an electrical schematic diagram of a sense amplifier using the features of the invention.

DETAILED DESCRIPTION OF SPECIFIC EMBODIMENT

Figure 1:
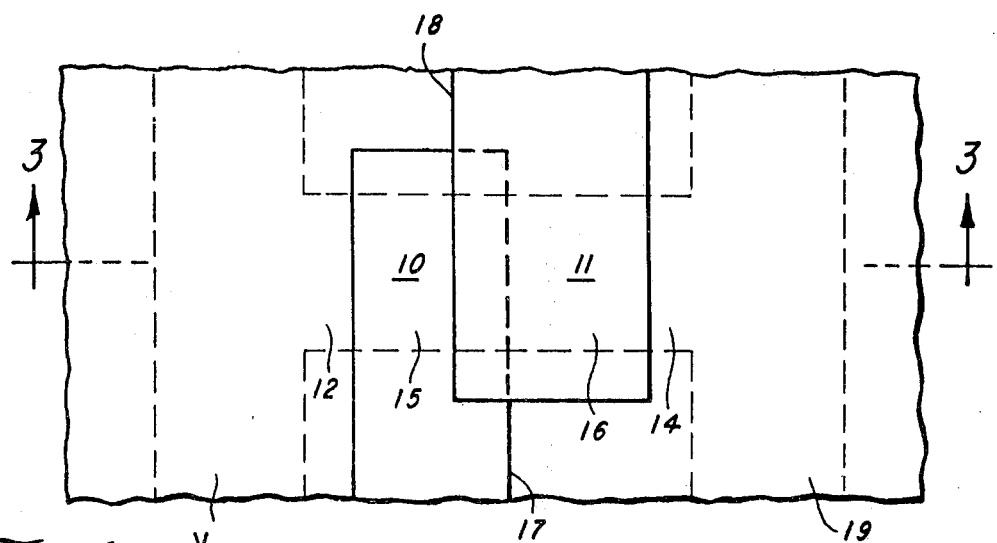
FIG. 1 is a greatly enlarged plan view of a small portion of a semiconductor chip showing the physical layout of a pair of transistors made according to the invention.
Figure 2:
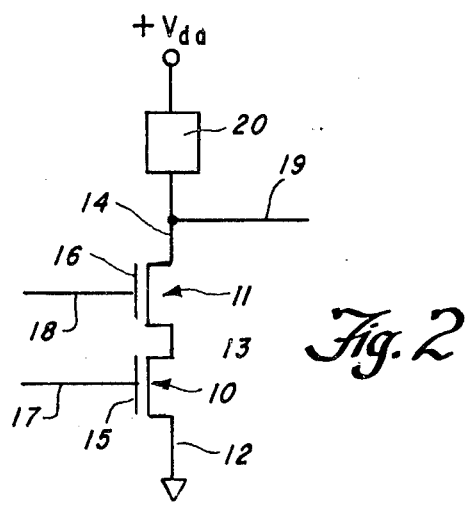
FIG. 2 is an electrical schematic diagram of the transistor pair of FIG. 1.

With reference to FIG. 1, a pair of transistors 10 and 11 employing the features of the invention is illustrated in cross section while FIG. 2 shows the same transistor pair in electrical schematic form. The transistor 10 has an N+ source 12 and a drain 13, and the transistor 11 shares a common area which functions as the drain 13 of the transistor 11 and the source of the transistor 10, and has an N+ drain 14. The gates 15 and 16 are separately connected to logic level inputs 17 and 18. An output node 19 is connected to the drain 14, and a load device 20 such as a transistor connects the output node to a Vdd positive voltage supply. The circuit is of course merely illustrative since the invention could be used in many different logic gates, flip-flops, or the like.

According to the invention, the gates 15 and 16 are formed separately of first and second level polycrystalline silicon, with an insulating coating 21 separating the two. A gate insulator 22 separates the gate 15 from its underlying induced channel, and a gate insulator 23 underlies the gate 16; typically the gate insulators are thermal silicon oxide. When a positive voltage of more than the threshold voltage Vt, typically +0.8 v., is applied to the gate 15 then a region 24 under the gate will invert, creating a channel or in effect creating a surface-adjacent N-type region. The right hand edge of this region 24 provides the source/drain 13 for the other transistor. Similarly, if the gate 16 has a positive voltage on it, an inverted channel region 25 is created, and the left hand edge of this inverted region provides the source/drain 13 of the transistor 10.

Figure 3:
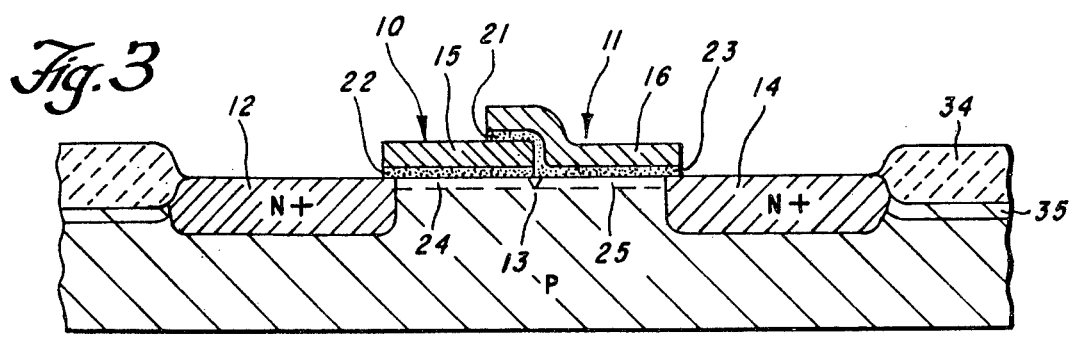
FIG. 3 is an elevation view in section of the cell of FIG. 1, taken along the line 3—3.

The advantages of the structure of FIGS. 1–3 are reduced overlap capacitance, reduced capacitance of the node 13, and smaller cell size. When an N+ diffusion is performed to create the regions 12 and 14, there is diffusion beneath the gate oxide 22 or 23 to produce an overlap between the outer edges of the gates 15 and 16 and the lateral N+ diffused portions of the regions 12 and 14. Ordinarily, if the intermediate source/drain region 13 were formed by the same diffusion as is usually the case, this same lateral diffusion would take place, resulting in additional overlap capacitance and also producing so-called short channel effects. But since the source/drain 13 is created by the edges of inverted regions 24 and 25, this added overlap capacitance does not exist, and the short channel effects are not as prevalent. Furthermore, the capacitance to the substrate which would have occurred between a diffused N+ region corresponding to the region 13 does not exist. When both transistors are off, the capacitance of the source/drain node 13 is virtually zero. Almost no voltage can be stored on this node and so the circuit can operate faster since the node need not be charged or discharged. In addition, the space usually occupied by a diffused region 13 between the two gates 15 and 16 is eliminated, so the cell size is much smaller.

Turning now to FIGS. 4a-4c, a process for making the ROM array of the invention will be described. The starting material is a slice of P-type monocrystalline silicon; in the FIGURES the portion shown of the bar 30 represents only a very small part of the slice, perhaps 1 or 2 mils wide for each part. After appropriate cleaning, the slice is oxidized by exposing to oxygen in a furnace at an elevated temperature to produce an oxide layer 31 over the entire slice of a thickness of about 1000 Angstroms. A layer 32 of silicon nitride of about 1000 Angstroms thickness is formed over the entire slice by exposing to an atmosphere of dichlorosilane and ammonia in a CVD reactor. A coating of photoresist is applied to the entire top surface of the slice, then exposed to ultraviolet light through a mask which defines the desired pattern of thick field oxide and underlying P+ channel stop. The resist is developed, leaving areas where nitride is then etched away by a nitride etchant, removing the exposed part of the nitride layer 32 but leaving in place the oxide layer 31.

Using the photoresist and nitride as a mask, the slice is now subjected to an ion implant step to produce channel stop regions, whereby boron atoms are introduced into unmasked regions 33 of silicon. The oxide layer 31 is left in place during the implant because it prevents the implanted boron atoms from out-diffusing from the surface during subsequent heat treatment. The regions 33 do not exist in the same form in the finished device, because some of this part of the slice will have been consumed in the field oxidation procedure. Usually the slice would be subjected to a heat treatment after implant but prior to field oxide growth, as set forth in my U.S. Pat. No. 4,055,444, assigned to Texas Instruments.

The next step in the process is formation of field oxide 34, which is done by standard thermal oxidizing techniques. This causes a thick field oxide region or layer 34 to be grown as seen in FIG. 4b. This region extends into the silicon surface because silicon is consumed as it oxidizes. The remaining parts of the nitride layer 32 mask oxidation. The thickness of this layer 34 is about 10000 Angstroms, about half of which is above the original surface and half below. The boron doped P+ regions 33 formed by implant will be partly consumed, but will also diffuse further into the silicon ahead of the oxidation front. Thus, P+ field stop regions 35 will result which will be much deeper than the original regions 33.

Next the remaining nitride layer 32 is removed by an etchant which attacks nitride but not silicon oxide, then the oxide 31 is removed by etching and the exposed silicon cleaned. The gate oxide 22 is grown by thermal oxidation to a thickness of perhaps 800 Angstroms. As will be seen, the gate oxide layer 22 may be grown a different thickness than the gate oxide 23 because they are grown at different times. In areas of the slice where depletion load devices are required, although not pertinent to this invention, a masked ion implant step would be done at this point. Likewise, the threshold voltage of enhancement mode transistors may be adjusted by ion implant. Also, windows for first polysilicon to silicon contacts, if needed, are patterned and etched at this point using photoresist; none are needed in the transistors shown.

As seen in FIG. 4b a first layer of polycrystalline silicon is deposited over the entire slice in a reactor using standard techniques, to a thickness of about 5000 Angstroms. Prior to patterning, this first poly layer is doped with phosphorus by an N+ diffusion to make it highly conductive. The first polysilicon layer is patterned by applying a layer of photoresist, exposing to ultraviolet light through a mask prepared for this purpose, developing, then etching both polysilicon and exposed oxide. The photoresist masks certain areas of the polysilicon to define the gate 15 and other transistor gates on the chip not pertinent to this invention. The unmasked polycrystalline silicon is etched away, so the resulting structure is seen in FIG. 4b.

According to the invention, the gate 16 is applied in a separate polysilicon deposition operation instead of in the same operation which defined the gate 15. A thermal oxide coating 21 is first applied to the first level poly and the gate oxide 23 is formed as seen in FIG. 4c by exposing the slice to steam or an oxygen atmosphere at high temperature to produce the coatings 21 and 23 of about 800 Angstroms or other thickness if a different threshold or other characteristic is desired for this transistor compared to the transistor 10. The coating 21 acts as an insulator where the first and second level poly overlaps, and also acts as an etch barrier when patterning the second level. The second poly is deposited by standard techniques to produce a layer of about 5000 Angstroms covering the entire slice. It is then patterned by photoresist to define the gate 16, as well as gates 39 of other transistors and interconnections in the peripheral circuitry on the chip. Then, the thin thermal oxide 21 and 23 is removed everywhere except under the gate 16 and the overlap, using the second level poly as an etch mask so self-alignment is provided. Now the slice is subjected to a standard N+ diffusion operation to produce the N+ source and drain regions 12 and 14 for the transistors 10 and 11, as well as other peripheral transistors. At the same time, the second level poly including the gate 16 is heavily doped to render it conductive. The resulting structure is that of FIG. 3.

A thick layer of silicon oxide (not shown) is deposited by decomposition of silane at a low temperature to insulate the metal from the polycrystalline silicon, and is referred to as multilevel oxide. The multilevel oxide layer is patterned by a photoresist operation, exposing contact areas for metal-to-polysilicon contacts and for metal-to-silicon contacts. Metal contacts and interconnections are used in various circuitry of a typical chip, as well as for the bonding pads which provide connection to external electrodes. The metal contacts and interconnections are made in the usual manner by depositing a thin film of aluminum over the entire top surface of the slice then patterning it by a photoresist mask and etch sequence. Usually a protective overcoating of low temperature oxide would be added over the metallization, then the slice scribed and broken into individual chips, and the chips mounted in packages.

In FIG. 5, a sense amplifier of the typical bistable type which may use the series transistor pair of the invention is shown. The output nodes would be connected to respective halves of the column lines of an MOS random access memory array of the type shown in FIG. 3 of U.S. Pat. No. 4,081,701, assigned to Texas Instruments. Also, the output nodes would be cross coupled to the gates 15 of the driver transistors 10 of the opposite half. Aside from smaller size, the advantages of the invention in this circuit is that the nodes 13 would not store charge and thus slow up the operation.

Figure 6:
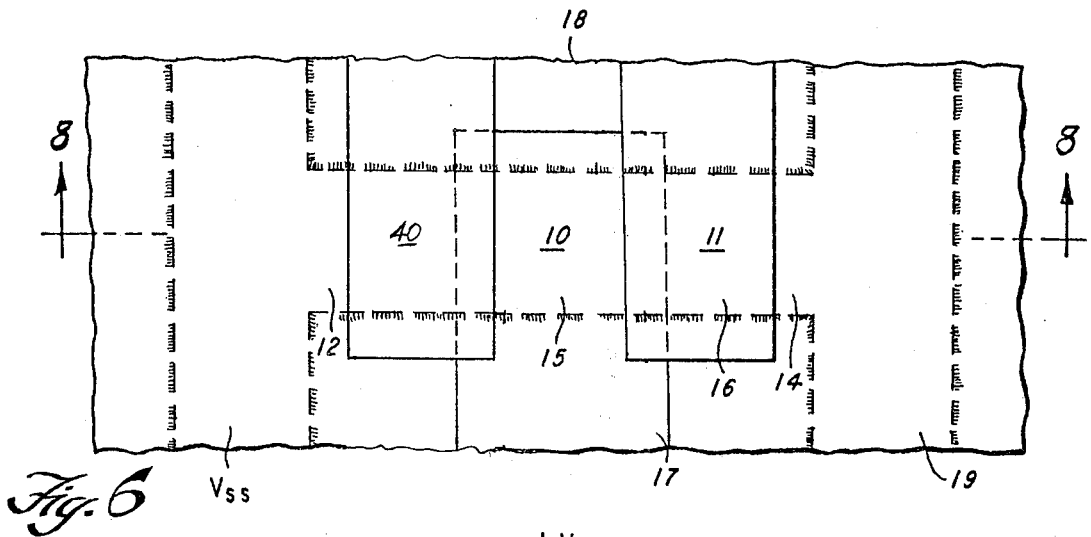
Figure 7:
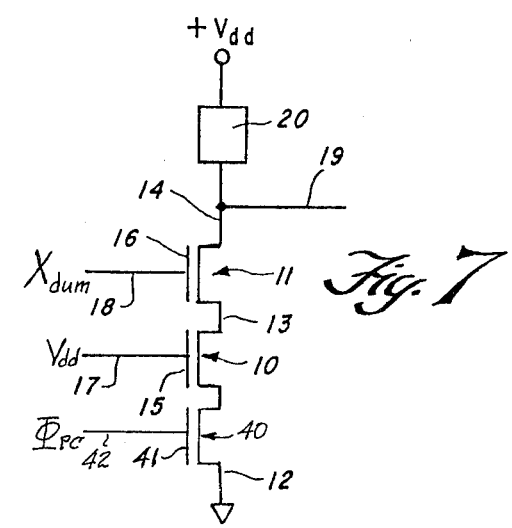
Figure 8:
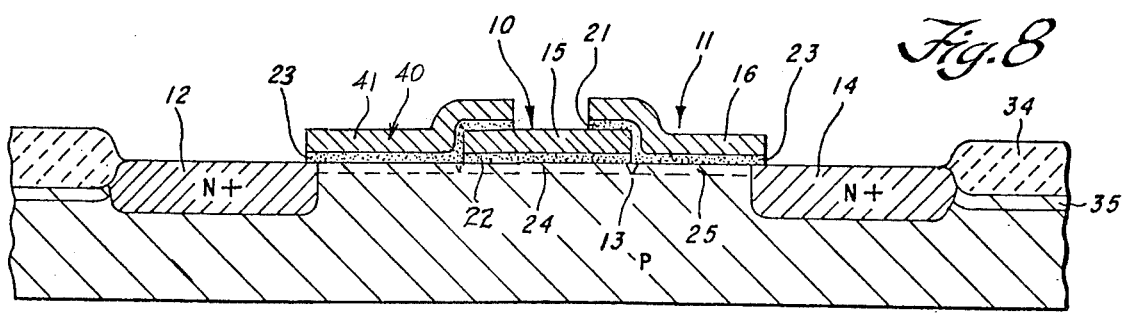

Another embodiment of the invention is illustrated in FIGS. 6, 7 and 8, which show a three transistor cell using series transistors. Here the transistor 10 in the center is actually used as a dummy capacitor in a dynamic RAM cell array of the type shown in Electronics, Sept. 28, 1978, at pp. 109-116. The transistor 11 is the dummy cell access transistor which has the Xdum row address line connected to its gate 16 by line 18. The third transistor 40 has its gate 41 connected by line 42 to a precharge clock voltage OPC. The gate 15 of the dummy cell capacitance (transistor 10) is permanently connected to a bias voltage Vdd, typically +5V, by the line 17. The line 19 in this case is the bit line half or column line half which has 128 one-transistor memory cells connected to it (in a 64 K bit RAM) and which is also connected to one side of a bistable differential sense amplifier. The load device 20 is the load for the sense amplifier and may be of the type shown in U.S. Pat. No. 4,081,701, issued to White, McAdams and Redwine, assigned to Texas Instruments. In operation of the circuit of FIG. 7, first OPC goes to logic 1 and predischarges the capacitor 10 to ground through the transistor 40; that is, the inverted region 24 forming the lower plate of the dummy cell capacitance is discharged. At this point Xdum is at logic 0. Next, OPC goes to logic 0 or Vss, and then if this row of dummy cells is selected by the X decoder the line 18 goes to logic 1 as Xdum goes high. With transistor 40 off and transistor 11 on, the column line half 19 will discharge slightly into the capacitance of the transistor 10. Typically, the dummy cell capacitance is about one-third the size of a memory cell capacitance in the memory cell array. The dummy cell on one side and a memory cell on the opposite side of the differential sense amplifier are simultaneously addressed and the dummy cell capacitance pulls down the voltage on the line 19 about halfway between that produced by a 1 and that produced by a 0 on the memory cell capacitance.

The device of FIGS. 6-8 is made by the exact same process as described above with reference to FIGS. 4a-4c. The gate 41 is part of the same second layer of polycrystalline silicon which forms the gate 16, and the gate oxide 23 for the transistor 40 is the same as that for the transistor 11.

Instead of the sequence shown in FIGS. 6 and 8 where the gate 15 is first level poly, the gates 16 and 41 can be first level poly and the gate 15 second level poly. In this case, the sides of the gate 15 would overlap the gates 16 and 41.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor device comprising a plurality of series-connected transistors formed in a face of a semiconductor body, each transistor having a source-to-drain path and a conductive gate, a thin inversion layer being formed beneath the conductive gate of each transistor when a gate voltage greater than a threshold is applied, an inner end of the source-to-drain path of each of the transistors being integrally connected in series with an inner end of the source-to-drain path of an adjacent one of the transistors via said inversion layer, the source or drain of each of the transistors at said inner end of the source-to-drain paths being formed by the edge of said inversion layer beneath the gate of said adjacent one of the transistors, the gate of at least one of the transistors being adjacent to and partially overlying the gate of an adjacent one of the transistors but insulated therefrom by an insulating layer, a pair of heavily-doped regions in the face in the semiconductor body at outer ends of the source-to-drain paths of two of the transistors forming sources or drains adjacent edges of said conductive gates, there being no heavily-doped source or drain region in the face of the semiconductor body between adjacent ones of transistors.

2. A semiconductor device according to claim 1 wherein the semiconductor body is P-type silicon, the conductive gates are polycrystalline silicon, and the heavily-doped regions are N-type.

3. A semiconductor device according to claim 1 wherein the heavily-doped source or drain at said outer ends of the source-to-drain paths are self-aligned with edges of said conductive gates.

4. A semiconductor device according to claim 1 wherein the plurality of transistors include three transistors and the conductive gate of the inner one of the three is overlapped by the gates of the outer two of the three.

5. A semiconductor device according to claim 4 wherein the conductive gates are polycrystalline silicon, the insulating layer is thermal silicon oxide, the semiconductor body is silicon of one type and the heavily-doped regions are of the opposite type.

6. A semiconductor device comprising three series-connected transistors formed in a face of a semiconductor body, each transistor having a source-to-drain path and a conductive gate, a thin inversion layer being formed beneath the conductive gate of each transistor when a gate voltage greater than a threshold is applied, an inner end of the source-to-drain path of each of the transistors being integrally connected in series with an inner end of the source-to-drain path of an adjacent one of the transistors via said inversion layers, the source or drain of each of the trasistors at said inner end of the source-to-drain paths being formed by the edge of said inversion layer beneath the gate of said adjacent one of the transistors, the gate of at least one of the transistors partially overlying the gate of an adjacent one of the transistors but insulated therefrom by an insulating layer, heavily-doped regions in the face in the semiconductor body at outer ends of the source-to-drain paths of the transistors forming sources or drains, there being no heavily-doped source or drain region in the face of the semiconductor body between adjacent trasistors.

7. A device according to claim 6 wherein the three transistors comprise a memory cell having first, second and third transistors.

8. A device according to claim 7 wherein the second transistor is positioned between the first and third transistors and functions as a storage capacitor.

9. A device according to to claim 8 wherein the second transistor has a fixed bias on its gate, the first transistor has an address voltage applied to its gate and functions as an access transistor, and the third transistor has a clock voltage applied to its gate and functions to predischarge the storage capacitor.

10. A device according to claim 9 wherein the semiconductor body is P-type silicon, the heavily-doped regions are N-type, the conductive gates are polycrystalline silicon, and the insulating layer is thermal silicon oxide.

* * * * *